(12) United States Patent
Li

(10) Patent No.: US 12,136,690 B2
(45) Date of Patent: Nov. 5, 2024

(54) LIGHT-EMITTING DEVICE

(71) Applicant: PanelSemi Corporation, New Taipei (TW)

(72) Inventor: Chin-Tang Li, Tainan (TW)

(73) Assignee: PANELSEMI CORPORATION, New Taipei (TW)

( * ) Notice: Subject to any disclaimer, the term of this patent is extended or adjusted under 35 U.S.C. 154(b) by 562 days.

(21) Appl. No.: 17/349,150

(22) Filed: Jun. 16, 2021

(65) Prior Publication Data

US 2021/0408348 A1 Dec. 30, 2021

(30) Foreign Application Priority Data

Jun. 24, 2020 (TW) ................................. 109121602

(51) Int. Cl.
| | |
|---|---|
| *H01L 33/60* | (2010.01) |
| *H01L 25/16* | (2023.01) |
| *H01L 33/58* | (2010.01) |
| *H01L 33/62* | (2010.01) |

(52) U.S. Cl.
CPC ............ *H01L 33/60* (2013.01); *H01L 25/167* (2013.01)

(58) Field of Classification Search
CPC ......... H01L 33/60; H01L 33/58; H01L 33/62; H01L 25/167; H01L 27/1214; F21V 7/00; G02B 6/0055; G02B 6/0021; G02F 1/133605; G02F 1/133602; G02F 1/133603; G02F 1/133604
See application file for complete search history.

(56) References Cited

U.S. PATENT DOCUMENTS

| | | | |
|---|---|---|---|
| 2017/0242300 A1* | 8/2017 | Lim | ................ G02F 1/1334 |
| 2018/0301600 A1* | 10/2018 | Ichikawa | ............. H01L 33/62 |
| 2019/0131579 A1* | 5/2019 | Li | ................ H01L 33/382 |
| 2020/0286872 A1* | 9/2020 | Choi | ............. G02F 1/133603 |

FOREIGN PATENT DOCUMENTS

| | | | | |
|---|---|---|---|---|
| CN | 101866910 A | | 10/2010 | |
| EP | 2854186 A1 * | 4/2015 | ............. F21K 9/20 |

* cited by examiner

*Primary Examiner* — Antonio B Crite
(74) *Attorney, Agent, or Firm* — MUNCY, GEISSLER, OLDS & LOWE, P.C.

(57) ABSTRACT

A light-emitting device comprises a transparent substrate, a reflection structure and a light-emitting unit. The transparent substrate is defined with a first surface and a second surface opposite to each other. The reflection structure is disposed on and contacts the second surface of the transparent substrate. The reflection structure includes a reflection layer and a circuit layer. The reflection structure is configured to define a light-transmitting window. The light-emitting unit is disposed corresponding to the light-transmitting window. The light-emitting unit is electrically connected to the circuit layer of the reflection structure, and one optical path of the light-emitting unit passes through the light-transmitting window.

18 Claims, 6 Drawing Sheets

LIGHT-EMITTING DEVICE

CROSS REFERENCE TO RELATED APPLICATIONS

This Non-provisional application claims priority under 35 U.S.C. § 119(a) on Patent Application No(s). 109121602 filed in Taiwan, Republic of China on Jun. 24, 2020, the entire contents of which are hereby incorporated by reference.

BACKGROUND

Technology Field

The present disclosure relates to an electronic device and, in particular, to a light-emitting device having a higher light output efficiency.

Description of Related Art

Light-emitting devices are one of the indispensable devices in modern life. The light sources used in light-emitting devices, for example, from the early incandescent lamps to the current fluorescent lamps and LED lamps, have been developed with significant progress in luminous efficiency and lifespan. Different from incandescent lamps, fluorescent lamps or compact fluorescent lamps, LEDs are luminescence devices, which have the advantages of low power consumption, long component life, no warm-up time, fast response, etc. Moreover, LED has the characteristics of small size, vibration-resistant, and suitable for mass production, so that it can be easily manufactured in an extremely small or array module to meet application needs. Therefore, LEDs can be widely used in the lighting equipment, the indicator of information, communication or consumer electronic product, the backlight module of display device, and/or the display device itself. The LEDs have become one of the indispensable important components in daily life.

SUMMARY

One or more exemplary embodiment of this disclosure is to provide a light-emitting device having a higher light output efficiency.

In an exemplary embodiment, a light-emitting device of this disclosure comprises a transparent substrate, a reflection structure and a light-emitting unit. The transparent substrate is defined with a first surface and a second surface, which are disposed opposite to each other. The reflection structure is disposed on and contacts the second surface of the transparent substrate. The reflection structure includes a reflection layer and a circuit layer, and the reflection structure is configured to define a light-transmitting window. The light-emitting unit is disposed corresponding to the light-transmitting window. The light-emitting unit is electrically connected to the circuit layer of the reflection structure, and one optical path of the light-emitting unit passes through the light-transmitting window.

In one embodiment, the reflection layer directly contacts the second surface of the transparent substrate, and distributes along the second surface of the transparent substrate.

In one embodiment, the circuit layer is arranged at one of two opposite sides of the reflection layer away from the second surface of the transparent substrate.

In one embodiment, the circuit layer directly contacts the second surface of the transparent substrate, and distributes along the second surface of the transparent substrate.

In one embodiment, the light-emitting device further comprises a driving unit electrically connected to the circuit layer of the reflection structure, and the driving unit comprises a driving member.

In one embodiment, the driving unit directly contacts the second surface of the transparent substrate, and distributes along the second surface of the transparent substrate.

In one embodiment, the driving unit and the light-emitting unit are integrated as one single component.

In one embodiment, the driving unit further comprises a substrate, and the driving member is disposed on the substrate and electrically connected to the circuit layer of the reflection structure.

In one embodiment, the driving member is a thin-film element, or a silicon-based semiconductor IC.

In one embodiment, the light-transmitting window is an opening.

In one embodiment, the light-emitting unit comprises a light-emitting member and a reflection cap covering the light-emitting member, the light-emitting member is arranged at one side beneath the second surface of the transparent substrate and electrically connected to the circuit layer of the reflection structure, an opening of the reflection cap corresponds to the light-transmitting window, and the light-emitting member emit lights toward the reflection cap.

In one embodiment, the light-emitting unit comprises a carrier and a light-emitting member, the light-emitting member is disposed on the carrier and facing toward the second surface of the transparent substrate, and the light-emitting member is electrically connected to the circuit layer of the reflection structure.

In one embodiment, the reflection layer is formed by a sputtering process.

In one embodiment, the reflection layer comprises aluminum metal material.

In one embodiment, the transparent substrate comprises glass material.

In one embodiment, the reflection structure further comprises an optical layer, and the optical layer is disposed at one side of the reflection layer opposing to the transparent substrate.

In one embodiment, the optical layer comprises an organic material being insulating and light-transmitting.

In one embodiment, the optical layer comprises an insulation substrate being light-transmitting.

In one embodiment, the light-emitting device further comprises a light-shielding unit disposed on the first surface of the transparent substrate, and the light-shielding unit comprises a plurality of light-shielding portions.

In one embodiment, one of the light-shielding portions obstructs the optical path of the light-emitting unit.

In one embodiment, one of the light-shielding portions overlays at least a part of the light-transmitting window in a direction perpendicular to the second surface of the transparent substrate.

In one embodiment, the light-shielding portions within the light-shielding unit are of a gradual distribution with a density decreasing away from the light-transmitting window.

In one embodiment, the light-emitting device further comprises an optical member disposed above the first surface of the transparent substrate.

In one embodiment, the optical member is a diffuser film, a diffuser sheet, or a quantum dots film.

As mentioned above, in the light-emitting device of this disclosure, the reflection structure is disposed on and contacts the second surface of the transparent substrate, and the reflection structure is configured to define a light-transmitting window. The light-emitting unit is disposed corresponding to the light-transmitting window and electrically connected to the circuit layer of the reflection structure, and at least one of the optical paths of the light-emitting unit passes through the light-transmitting window. Accordingly, the lights emitted from the light-emitting unit can travel along the at least one of the optical paths to pass through the light-transmitting window, to enter the transparent substrate through the second surface (the light input surface), to travel inside the transparent substrate, and to exit the transparent substrate through the first surface (the light output surface). Since the reflection structure, which is disposed on the second surface (the light input surface) of the transparent substrate, includes a reflection layer, the lights entered the transparent substrate can be limited above the reflection layer and is seldom outputted through the second surface (the light input surface). As one benefit, the light-emitting device of the disclosure can have a higher light output efficiency.

In some embodiments of this disclosure, the first surface (the light output surface) of the transparent substrate is further configured with the light-shielding unit (the light-shielding portions), and one of the light-shielding portions obstructs at least one of the optical paths of the light-emitting unit. Accordingly, the light traveling inside the transparent substrate can exit the transparent substrate through the area of the first surface configured without the light-shielding portions. One benefit of this configuration can reduce or prevent the generation of hot spots in the light-emitting device, and can achieve the effect of uniform light outputting.

BRIEF DESCRIPTION OF THE DRAWINGS

The disclosure will become more fully understood from the detailed description and accompanying drawings, which are given for illustration only, and thus are not limitative of the present disclosure, and wherein.

DETAILED DESCRIPTION OF THE DISCLOSURE

The present disclosure will be apparent from the following detailed description, which proceeds with reference to the accompanying drawings, wherein the same references relate to the same elements.

The light-emitting devices of the following embodiments can be applied to lighting equipment, the indicator of information, communication or consumer electronic product, the backlight module of display device, or the display device itself. In order to clearly illustrate the present disclosure, the drawings in the following embodiments are only schematic illustrations, and the sizes and proportions of the components are only for describing the technology of the present disclosure and are not to limit the present disclosure.

Figure 1:
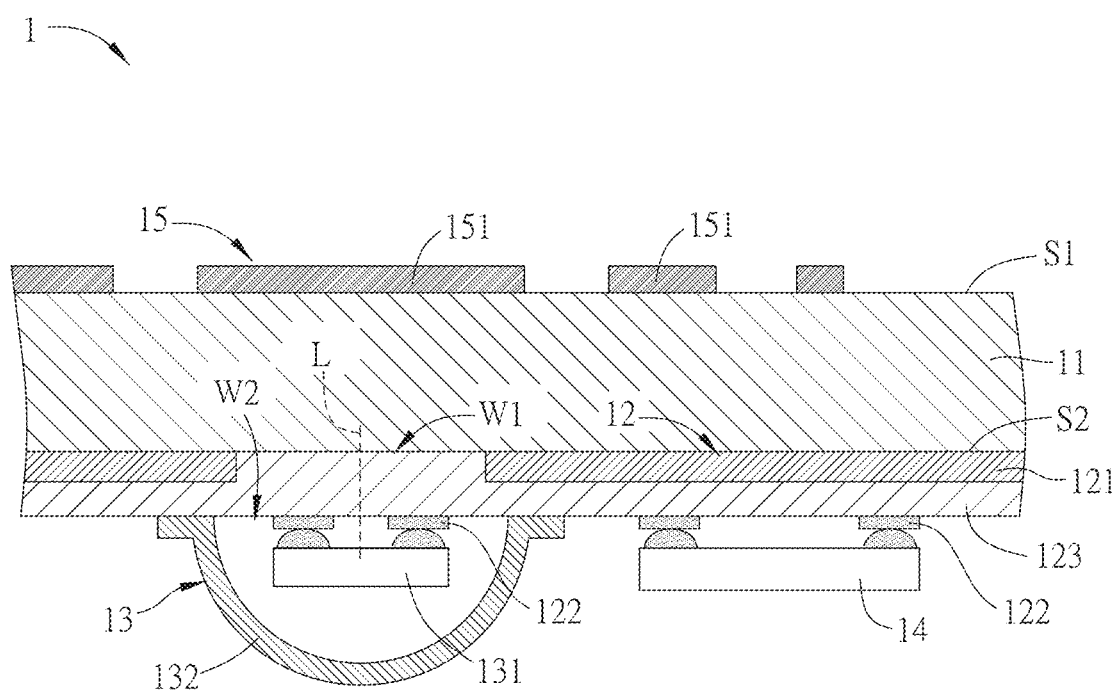
FIG. 1 is a sectional view of a light-emitting device according to an embodiment of this disclosure.
Figure 2:
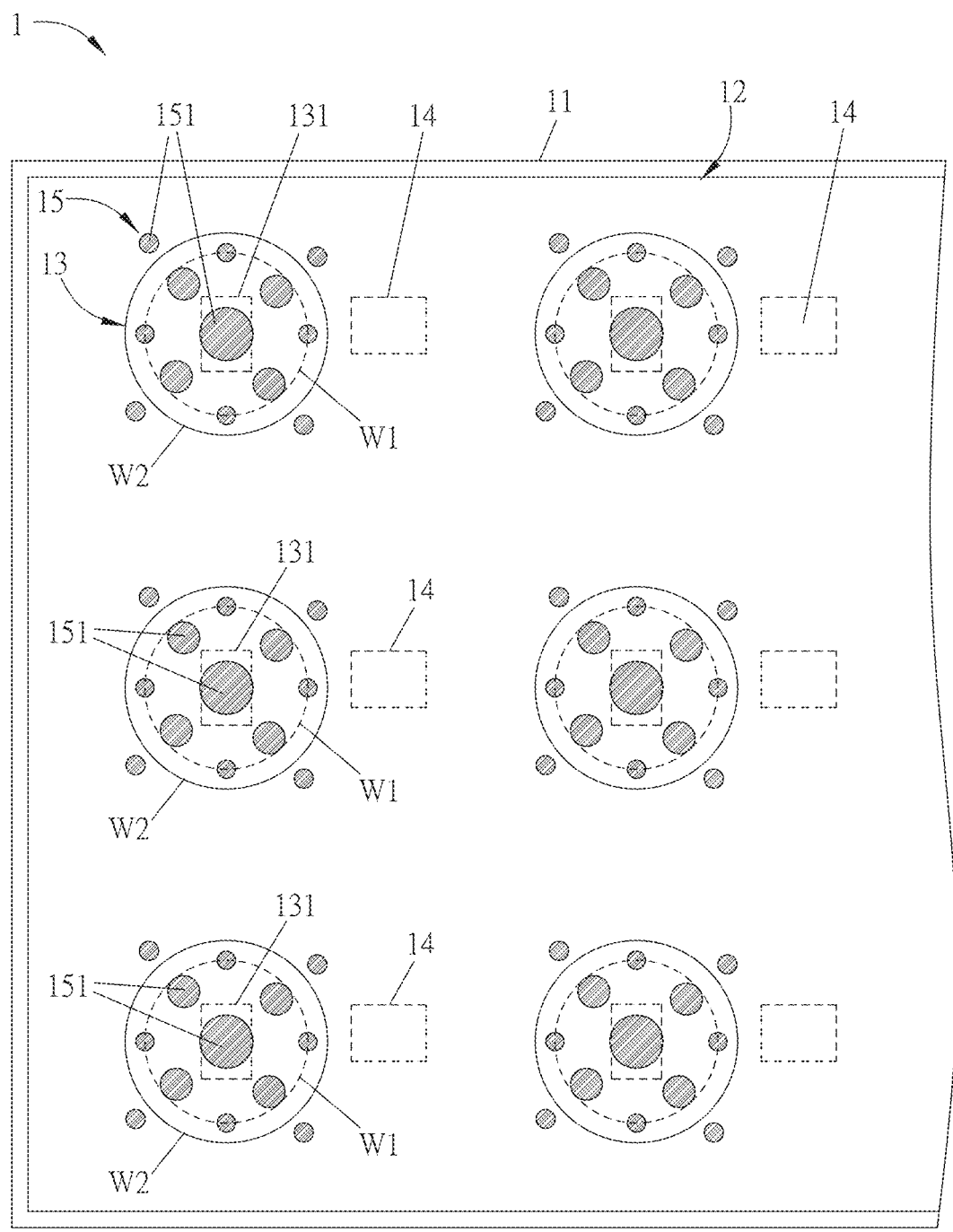
FIG. 2 is a top view of the light-emitting device according to the embodiment of this disclosure.

FIG. 1 is a sectional view of a light-emitting device according to an embodiment of this disclosure, and FIG. 2 is a top view of the light-emitting device according to the embodiment of this disclosure.

Referring to FIGS. 1 and 2, the light-emitting device 1 comprises a transparent substrate 11, a reflection structure 12, and a light-emitting unit 13. In this embodiment, the reflection structure 12 comprises a reflection layer 121 and a circuit layer 122. In one embodiment, the light-emitting device 1 further comprises a driving unit 14 and a light-shielding unit 15.

The transparent substrate 11 is defined with a first surface S1 and a second surface S2, which are opposite to each other. The transparent substrate 11 is an insulation substrate, which can be a rigid substrate, a flexible substrate or the combination thereof (e.g. a rigid substrate with a flexible substrate stacked thereon). The rigid substrate may comprise glass material, e.g. the rigid substrate can be, for example but not limited to, a glass substrate. The flexible substrate may comprise polymeric material, e.g. the flexible substrate can be, for example but not limited to, a PI (polyimide) substrate. In this embodiment, the transparent substrate 11 is a transparent glass substrate such as, for example, a light-guiding plate.

The reflection structure 12 is disposed on the second surface S2 of the transparent substrate 12, and contacts the second surface S2 of the transparent substrate 12 so as to be configured to provide a light reflection function. Herein, the reflection structure 12 defines at least one light-transmitting window W1. In this embodiment, the reflection layer 121 of the reflection structure 12 directly contacts the second surface S2 of the transparent substrate 11 and continuously distributes along the second surface S2 of the transparent substrate 11 with the light-transmitting window W1 configured thereto, in which the light-transmitting window W1 can be formed as an opening of the reflection layer 121. In some embodiments, the reflection layer 121 can be a reflection film made by a sputtering process. For example, the sputtering process can be applied onto the second surface S2 of the transparent substrate 11 directly so as to form the reflection layer 121. In some embodiments, the reflection layer 121 is a metallic material, and the metallic material thereof comprises, for example but not limited, metal (e.g. silver or aluminum), compound, or alloy thereof, or the reflection layer 121 is a non-metallic material, and the non-metallic material thereof comprises, for example but not limited, titanium dioxide ($TiO_2$) or resin, or a mixture thereof. This embodiment is not limited thereto. In addition, the circuit layer 122 of the reflection structure 12 is arranged at one of two opposite sides of the reflection layer 121 away from the second surface S2 of the transparent substrate 11. The light-transmitting window W1 is defined at least by the reflection layer 121 and the circuit layer 122. In some embodiments, the circuit layer 122 directly contacts the second surface S2 of the transparent substrate 11, and distributes along the second surface S2 of the transparent substrate 11; in other words, the reflection layer 121 and the circuit layer 122 are arranged along the second surface S2 of the transparent substrate 11 together. In another aspect, at least a part of the circuit layer 122 and the reflection layer 121 are together distributed along the second surface S2 of the transparent substrate 11 (e.g. in an alternate distribution), so that the circuit layer 122 and the reflection layer 121 can together form a surface with the reflection function. In some embodiments, the reflectivity of the circuit layer 122 can be less than that of the reflection layer 121, but this disclosure is not limited thereto. In some embodiments, the circuit layer 122 is arranged at one of two opposite sides of the reflection layer 121 away from the second surface S2 of the transparent substrate 11, in this case, a non-conductive material could be applied between the circuit layer 122 and the reflection layer 121.

In some embodiments, the reflection structure 12 further comprises an optical layer 123, which is disposed at one of two opposite sides of the reflection layer 121; wherein the optical layer 123 is disposed at the side of the reflection layer 121 opposite to the transparent substrate 11. In this case, the optical layer 123 covers on or above the reflection layer 121; the optical layer 123 could be the non-conductive material arranged between the reflection layer 121 and the circuit layer 122, and the circuit layer 122 is disposed on one of two opposite surfaces of the optical layer 123 away from the transparent substrate 11. In some embodiments, the optical layer 123 is a planarization layer, which comprises an organic material (e.g. organosilicon oxygen compound or perfluoroalkoxy alkanes (Polyfluoroalkoxy, PFA)) being insulating and light-transmitting; in this case, the surface of the optical layer 123 away from the transparent substrate 11 is a planar surface, and the circuit layer 122 can be disposed on the planar surface thereof to define the light-transmitting window W1 together with the reflection layer 121. Moreover, in this embodiment, the electrical connection function of the circuit layer 122 is not affected by the optical layer 123. For example, the electrical connections of the circuit layer 122 can be formed via the optical layer 123. The optical layer 123 can optionally have a thinner thickness cooperating with the improvement of the entire optical efficiency, but this disclosure is not limited thereto.

The light-emitting unit 13 is disposed corresponding to the light-transmitting window W1, and the light-emitting unit 13 is electrically connected to the circuit layer 122 of the reflection structure 12. The light-emitting unit 13 may comprise a surface mount device (SMD), such as an LED chip or package, which can be disposed on the circuit layer 122 of the reflection structure 12 by surface mount technology (SMT) and electrically connected to the circuit layer 122 of the reflection structure 12. In this embodiment, the light-emitting unit 13 can create a plurality of optical paths, and at least one of the optical paths enters the transparent substrate 11 through the light-transmitting window W1. In some embodiments, the light-emitting unit 13 further defines a lighting mean axis L, and the light-emitting unit 13 emits light along the lighting mean axis L through the light-transmitting window W1. In some embodiments, the lighting mean axis L is perpendicular to the second surface S2 of the transparent substrate 11, while the lighting mean axis L maybe not perpendicular to the second surface S2 of the transparent substrate 11 in some other embodiments.

The light-emitting unit 13 of this embodiment comprises a light-emitting member 131 and a reflection cap 132 covering the light-emitting member 131. The light-emitting member 131 is arranged at one side beneath the second surface S2 of the transparent substrate 11. Herein, the light-emitting member 131 is electrically connected to the circuit layer 122 of the reflection structure 12, an opening of the reflection cap 132 corresponds to the light-transmitting window W1, and the light-emitting member 131 emits light toward the reflection cap 132. The light-emitting member 131 in this case is disposed at one side of the optical layer 123 (the planarization layer) away from the transparent substrate 11, in other words, the light-emitting member 131 is disposed on the second surface S2 of the transparent substrate 11 in an indirect manner. The light-emitting member 131 is located on the circuit layer 122 of the reflection structure 12 and electrically connected to the circuit layer 122. In some embodiments, the light-emitting unit 13 is further defined with a light-emitting window W2 facing the transparent substrate 11, and the light-emitting window W2 corresponds to the light-transmitting window W1 for light traveling. In this embodiment, the light-emitting window W2 is defined by the opening of the reflection cap 132, and the light-emitting member 131 emits light toward the reflection cap 132. In some embodiments, the light-transmitting window W1 can be smaller than the opening of the reflection cap 132. Herein, the light emitted from the light-emitting member 131 can be reflected by the reflection cap 132 and then enter the transparent substrate 11 through the light-emitting window W2 and the light-transmitting window W1 along at least one optical path. For example, the light can travel in the direction along the lighting mean axis L and through the opening (the light-emitting window W2) of the reflection cap 132 and the light-transmitting window W1, and then travels in the transparent substrate 11. To be noted, the term "correspond", such as the opening of the reflection cap 132 corresponds to the light-transmitting window W1, or the light-emitting window W2 corresponds to the light-transmitting window W1, is not limited to the definition that the center lines of two objects are aligned to each other. In addition, the lighting mean axis L can be aligned (or not) to the center line of the above-mentioned component. In this embodiment, two components are corresponded to each other can be optionally realized as two components are aligned to each other (in cooperate with the improvement of the entire optical efficiency), but this disclosure is not limited thereto.

In this embodiment, the light-emitting member 131 can be, for example but not limited to, a LED chip, MiniLED chip, MicroLED chip, or any of the packages thereof. Besides, the light-emitting member 131 can be a light-emitting chip or a chip in package of any size in millimeters, micrometers, or below. The above-mentioned chip can include a die with horizontal electrodes, flip-chip electrodes or vertical electrodes, which is electrically connected to the circuit layer 122 of the reflection structure 12 by wire bonding or flip-chip bonding.

In addition, the driving unit 14 of this embodiment is electrically connected to the circuit layer 122 of the reflection structure 12, thereby driving the light-emitting unit 13 to emit light. In some embodiments, the driving unit 14 is located at one side on or beneath the second surface S2 of the transparent substrate 11. Herein, the driving unit 14 in this case is disposed at one side of the optical layer 123 away from the transparent substrate 11, and is electrically connected to the light-emitting unit 13 through the circuit layer 122 of the reflection structure 12. In some embodiments, the driving unit 14 can be disposed at any side of the reflection layer 121 of the reflection structure 12, which is next onto or opposite to the transparent substrate 11. In some embodiments, the driving unit 14 can directly contact the second surface S2 of the transparent substrate 11, and be distributed along the second surface S2 of the transparent substrate 11, so that it can be electrically connected to the circuit layer 122 of the reflection structure 12. In some embodiments, one driving unit 14 can drive one light-emitting unit 13 to emit light, or one driving unit 14 can drive multiple light-emitting units 13 to emit light. This disclosure is not limited. In this embodiment, the amount of the driving unit 14 is, for example but not limited to, one.

The driving unit 14 and the circuit layer 12 can be individual from or incorporated with each other. For example, but not limited to, the driving unit 14 is formed on the circuit layer 12 by a thin-film process and then electrically connected to the circuit layer. In another aspect, the driving unit 14 can be a surface mounted device made by, for example, a thin-film process, and be disposed on the circuit layer 122 of the reflection structure 12 by the surface mounted technology and electrically connected to the circuit layer 122 of the reflection structure 12. In yet another aspect, the driving unit 14 can comprise a silicon-based semiconductor IC, which is directly or indirectly bonded to the circuit layer 122 of the reflection structure 12. This disclosure is not limited thereto. In some embodiments, the driving unit 14 can also be disposed at any position other than the above-mentioned side of the second surface S2 of the transparent substrate 11 as long as not interfering the first surface S1 of the transparent substrate 11. For example, the driving unit 14 can be disposed on an additional substrate (excluding the circuit layer 122 of the reflection structure 12). The additional substrate can be located at one end of the transparent substrate 11, or one side of the second surface S2 of the transparent substrate 11, and or further parallel to the transparent substrate 11. In some embodiments, the driving unit 14 comprises at least one driving member (not shown), which can drive the light-emitting unit 13 to emit light via the reflection structure 12. The driving member may comprise a thin-film element, and/or relevant thin-film circuit (e.g. a conductive layer, circuit for transmitting signals), or film layer (e.g. an insulation layer). Herein, the thin-film element can be, for example but not limited to, a thin-film transistor (TFT). In some embodiments, the driving member can also be a semiconductor IC, for example, but not limited thereto, a silicon-based semiconductor IC. In this embodiment, except the driving member, the driving unit 14 can further comprise a substrate (not labeled). The driving member is disposed on the substrate so as to form an independent and individual component, and is electrically connected to the circuit layer 122 of the reflection structure 12. In some embodiments, the driving unit 14 can be disposed with the light-emitting unit 13, so that the driving unit 14 and the light-emitting unit 13 can be integrated as one single component, which is an active light-emitting unit. In some embodiments, the numbers of the light-transmitting windows W1, the light-emitting units 13, and the driving units 14 can be more than one, and they are arranged in a two-dimensional array (see FIG. 2). In this case, the light-emitting units 13 are disposed corresponding to the light-transmitting windows W1, respectively, and the driving units 14 drive the corresponding light-emitting units, respectively.

To be noted, as shown in FIG. 1, in cooperating with the improvement of the entire optical efficiency, the light-transmitting window W1 can be smaller than the light-emitting window W2 in the direction perpendicular to the second surface S2 of the transparent substrate 11, but this disclosure is not limited thereto. In other embodiments, the light-transmitting window W1 can be greater than or equal to the light-emitting window W2. As shown in FIG. 2, in this embodiment, the light-transmitting window W1 is totally overlapped with the light-emitting window W2, and the shapes (top view) of the light-transmitting window W1 and the light-emitting window W2 are both a circle. This disclosure is not limited thereto. In different embodiments, the light-transmitting window W1 is partially overlapped with the light-emitting window W2, or/and the shapes (top view) of the light-transmitting window W1 and the light-emitting window W2 can be any of other shapes such as oval, polygon, irregular, or a combination thereof.

In some embodiments, one light-shielding unit 15 is disposed on the first surface S1 of the transparent substrate 11. The light-shielding unit 15 comprises a plurality of light-shielding portions 151, and one of the light-shielding portions 151 obstructs at least one of the optical paths of the light-emitting unit 13, in which the light traveling along the optical path, supposed to exit the transparent substrate 11 but obstructed by the one light-shielding portion 151, could go back and travel in the transparent substrate 11 again. This configuration can reduce or avoid the generation of hot spots, so that the light-emitting device 1 can have higher lighting uniformity. For example, one of the light-shielding portions 151 can overlay at least one part of the light-transmitting window W1 in the direction perpendicular to the second surface S2 of the transparent substrate 11. In some embodiments, the quantity of the light-shielding units 15 corresponds to that of the light-emitting units 13.

The light-shielding unit 15 can be formed by, for example, coating, screen printing, or ink-jet printing. In this embodiment, the light-shielding portions 151 are formed on the first surface S1 of the transparent substrate 11 by printing. Accordingly, the positions, density, concentration or weight percentage of the light-shielding portions 151, which are formed on the first surface S1, can be easily controlled, and this manufacturing process is stable and simple. In addition, the printing process can be optionally repeated based on the process requirement. The shape of each light-shielding portion 151 can be a circle, oval, polygon, or any combination thereof. In this embodiment, the shape of the light-shielding portion 151 is circle. In some embodiments, the light-shielding portions 151 of the light-shielding unit 15 are of a gradual distribution with a density decreasing away from the light-transmitting window W1 (the density of the light-shielding portions 151 decreases as the distance to the center of the light-transmitting window W1 increases). In addition, in the top view of the second surface S2 of the transparent substrate 11 (viewing from the direction perpendicular to the second surface S2), one of the light-shielding portions 151 (e.g. the largest one of the light-shielding portions 151) is located right above the light-emitting member 131 of the light-emitting unit 13 in the direction perpendicular to the second surface S2 of the transparent substrate 11.

As mentioned above, in the light-emitting device 1 of this embodiment, the light-emitting member 131 of the light-emitting unit 13 emits light toward the reflection cap 132, and the light is reflected by the reflection cap 132 and passes through the light-transmitting window W1 along the optical path (e.g. the direction parallel to the lighting mean axis L). Then, the light can enter the transparent substrate 11 through the second surface S2 (the light input surface), travel inside the transparent substrate 11, and then exit the transparent substrate 11 through the first surface S1 (the light output surface). Since the second surface S2 of the transparent substrate 11 is configured with the reflection layer 121 of the reflection structure 12, the light entering the transparent substrate 11 will be limited in the space above the reflection layer 121 of the reflection structure 12, and is seldom outputted through the second surface S2 (the light input surface). Therefore, the light-emitting device 1 can have a great light output efficiency.

In addition, the first surface S1 (the light output surface) of the transparent substrate 11 is configured with the light-shielding unit 15 (including the light-shielding portions 151), one of the light-shielding portions 151 obstructs the optical path of the light-emitting unit 13, and one of the light-shielding portions 151 overlays at least a part of the light-transmitting window W1 in the direction perpendicular to the second surface S2 of the transparent substrate 11. Accordingly, the light travel inside the transparent substrate 11 can exit the transparent substrate 11 through the area of the first surface S1 configured without the light-shielding portions 151. This configuration can reduce or prevent the generation of hot spots in the light-emitting device 1, and can achieve the effect of uniform light outputting.

Figure 3A:
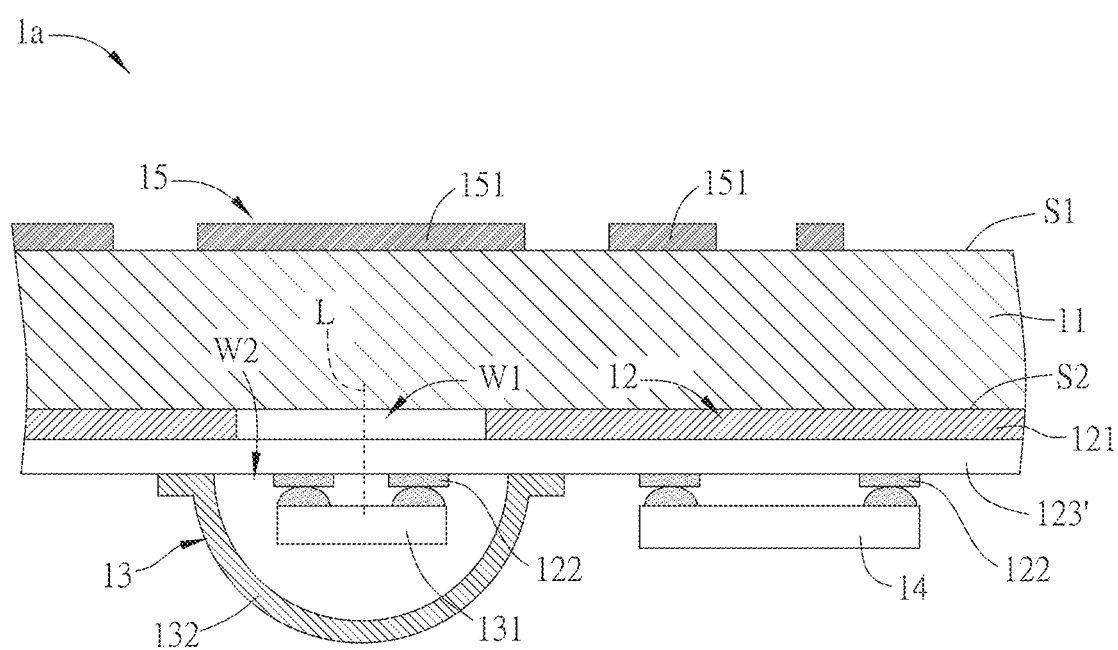
FIGS. 3A to 3D are schematic diagrams showing the light-emitting devices according to different embodiments of this disclosure.

FIGS. 3A to 3D are schematic diagrams showing the light-emitting devices according to different embodiments of this disclosure. As shown in FIG. 3A, the compositions and connections of components in the light-emitting device 1a of this embodiment are mostly the same as those of the light-emitting device 1 of the previous embodiment. Different from the previous embodiment, in the light-emitting device 1a of this embodiment, the optical layer 123' of the reflection structure 12 is a light-permeable insulation substrate (e.g. a light-permeable glass substrate) instead of a planarization layer. The optical layer 123' can be disposed on the second surface S2 of the transparent substrate 11 by, for example, pressing or gluing, so that the reflection layer 121 can be sandwiched between the transparent substrate 11 and the insulation substrate (the optical layer 123'). In this embodiment, the light-transmitting window W1 can be an opening without filling any material. In other embodiments, the light-transmitting window W1 can also be an opening filled with a material being light-transmitting.

Figure 3B:
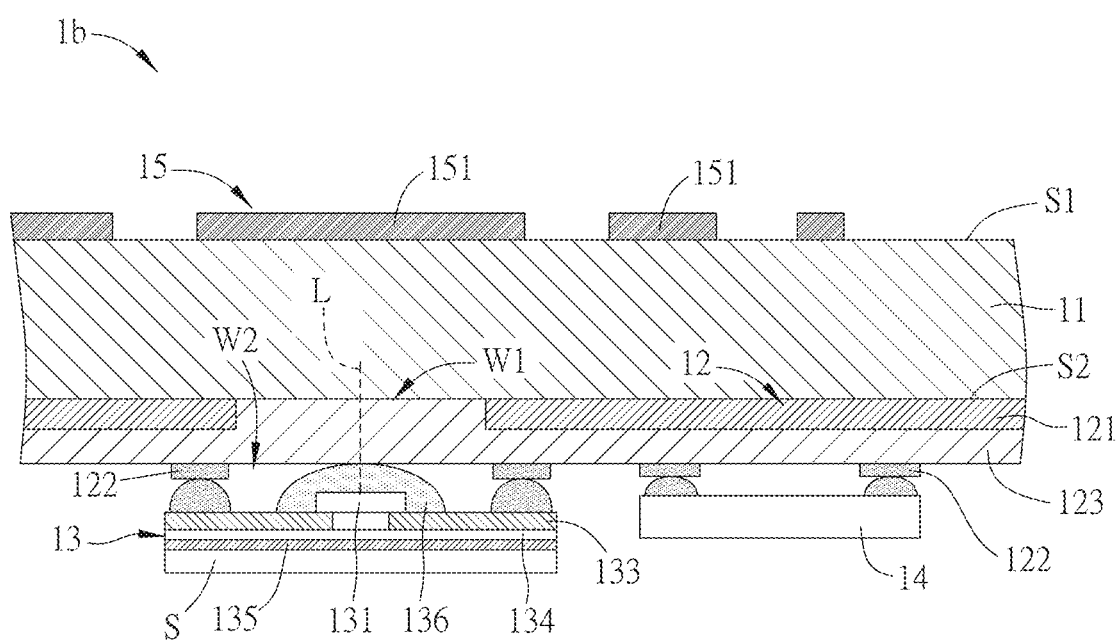

In addition, as shown in FIG. 3B, the compositions and connections of components in the light-emitting device 1b of this embodiment are mostly the same as those of the light-emitting device 1 of the previous embodiment. Different from the previous embodiment, in the light-emitting device 1b of this embodiment, the light-emitting unit 13 is a packaged device, which comprises a carrier S (e.g. a PI substrate), and a light-emitting member 131 disposed on the carrier S and facing toward the second surface S2 of the transparent substrate 11. The light-emitting member 131 is electrically connected to the circuit layer 122 of the reflection structure 12, and emits light toward the second surface S2 of the transparent substrate 11. Moreover, a reflection film 135, an insulation film 134 and a conductive circuit 133 can be formed on the carrier S of the light-emitting unit 13. The reflection film 135 can comprise aluminum metal material or non-aluminum metal material (e.g. titanium dioxide or silver). The light-emitting member 131 can be electrically connected to the circuit layer 122 of the reflection structure 12 via the conductive circuit 133. The insulation film 134 is located between the reflection film 135 (e.g. an aluminum reflection film) and the conductive circuit 133 for preventing short-circuit of the reflection film 135 and the conductive circuit 133. Accordingly, an optical path is defined as: when the light, emitted toward the transparent substrate 11, is reflected back to the light-emitting unit 13, the reflected light can be reflected again by the reflection film 135 and then pass through the light-emitting window W2. Furthermore, the light-emitting unit 13 of this embodiment further comprises a protection layer 136. The protection layer 136 can be, for example, a sealant, which covers the light-emitting member 131, thereby preventing the moisture or dusts entered the light-emitting member 131 from interfering the lighting function of the light-emitting member 131. The light-emitting unit 13 of this embodiment is integrated with the driving unit 14 t as an active light-emitting unit.

Figure 3C:
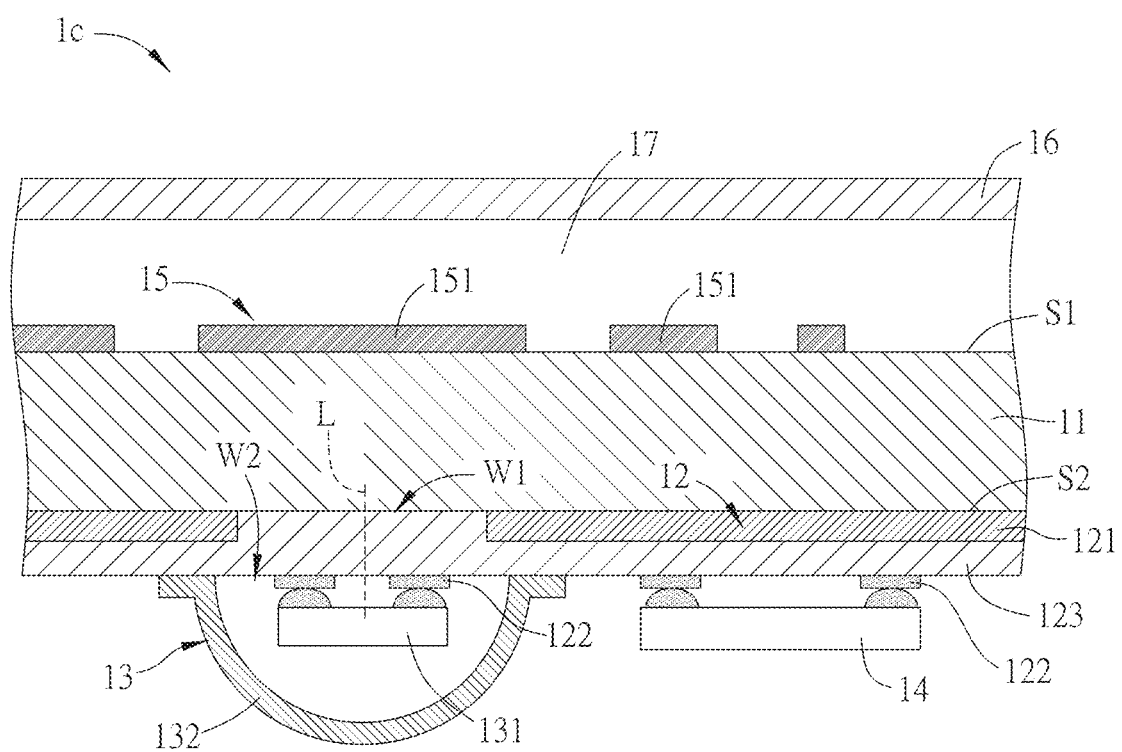

In addition, as shown in FIG. 3C, the compositions and connections of components in the light-emitting device 1c of this embodiment are mostly the same as those of the light-emitting device 1 of the previous embodiment. Different from the previous embodiment, the light-emitting device 1c of this embodiment further comprises one or more optical members 16, and the optical member 16 is disposed above (for example, over or on) the first surface S1 of the transparent substrate 11. In one aspect, the optical member 16 can be directly disposed on the first surface S1 of the transparent substrate 11 (air gap(s) may be created between the optical member 16 and the first surface S1, but no adhesive is provided therebetween). In another aspect, the optical member 16 can be indirectly disposed on the first surface S1 of the transparent substrate 11 with providing an adhesive provided therebetween. In this embodiment, for example, the optical member 16 is attached to the first surface S1 of the transparent substrate 11 by applying an adhesive layer 17. The adhesive layer 17 can be, for example but not limited to, an optically clear adhesive (OCA).

The optical member 16 can be a diffuser film, a diffuser sheet, or a quantum dots film. When the optical member 16 is a diffuser film or a diffuser sheet, it is an optical element with continuous optical characteristics for softening or transmitting the light emitted from the light-emitting member 131 (e.g. a MicroLED chip), thereby making the light-emitting device 1c output uniform light. When the optical member 16 is a quantum dots film, it can comprise a plurality of quantum dots (preferably different quantum dots with two different shapes or sizes) for absorbing the high-energy light emitted from the light-emitting member 131 to excite visible light of different bandwidths. For example, two kinds of quantum dots can absorb the high-energy blue light or UV light to excite the low-energy red light and green light. The residual high-energy blue light and the excited red light and green light can be outputted from the quantum dots film to form a white light. In different embodiments, the quantum dots can absorb the high-energy blue light and green light to excite the low-energy red light (in this case, it needs only one size or shape of quantum dots, and the conversion efficiency is better). The residual high-energy blue light and green light and the excited red light can be outputted from the quantum dots film to form a white light.

Figure 3D:
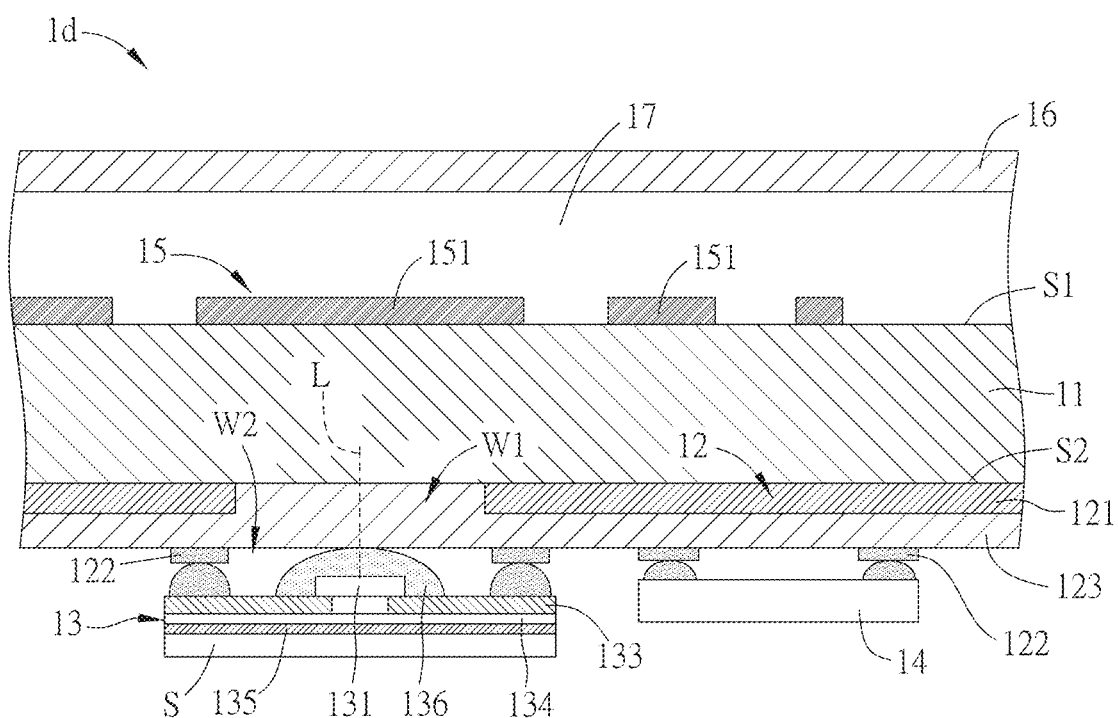

In addition, as shown in FIG. 3D, the compositions and connections of components in the light-emitting device 1d of this embodiment are mostly the same as those of the light-emitting device 1b of the previous embodiment. Different from the previous embodiment, the light-emitting device 1d further comprises an optical member 16, which is disposed above (for example, over or on) the first surface S1 of the transparent substrate 11. Herein, the air gap(s) may be created between the optical member 16 and the transparent substrate 11 (e.g. no adhesive is provided therebetween). In this embodiment, the optical member 16 is attached to the first surface S1 of the transparent substrate 11 by applying an adhesive layer 17. The adhesive layer 17 can be, for example but not limited to, an optically clear adhesive (OCA).

In summary, in the light-emitting device of this disclosure, the reflection structure is disposed on and contacts the second surface of the transparent substrate, and the reflection structure is configured to define a light-transmitting window. The light-emitting unit is disposed corresponding to the light-transmitting window and electrically connected to the circuit layer of the reflection structure, and one optical path of the light-emitting unit passes through the light-transmitting window. Accordingly, the light emitted from the light-emitting unit can travel along the optical path to pass through the light-transmitting window, to enter the transparent substrate through the second surface (the light input surface), to travel inside the transparent substrate, and to exit the transparent substrate through the first surface (the light output surface). Since the reflection structure, which is disposed on the second surface (the light input surface) of the transparent substrate, includes a reflection layer, the light entered the transparent substrate can be limited above the reflection layer and is seldom outputted through the second surface (the light input surface). As one benefit, the light-emitting device of the disclosure can have a higher light output efficiency.

In addition, in some embodiments of this disclosure, the first surface (the light output surface) of the transparent substrate is further configured with the light-shielding unit (the light-shielding portions), and one of the light-shielding portions obstructs at least one optical path of the light-emitting unit. Accordingly, the light traveling inside the transparent substrate can exit the transparent substrate through the area of the first surface configured without the light-shielding portions. One benefit of this configuration can reduce or prevent the generation of hot spots in the light-emitting device.

Since the light-emitting device of this disclosure can have higher light output efficiency and/or better light output uniformity, under the circumstance of equivalent optical characteristics of the entire light-emitting device, this disclosure can achieve the advantage of reducing the total amount of light-emitting units, thereby reducing the total manufacturing cost.

Although the disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the disclosure.

What is claimed is:

1. A light-emitting device, comprising:
    a transparent substrate defined with a first surface and a second surface disposed opposite to each other;
    a reflection structure disposed on and contacting the second surface of the transparent substrate, wherein the reflection structure includes a reflection layer and a circuit layer, and the reflection structure is configured to define a light-transmitting window; and
    a light-emitting unit disposed corresponding to the light-transmitting window, wherein the light-emitting unit is electrically connected to the circuit layer of the reflection structure, and one optical path of the light-emitting unit passes through the light-transmitting window,
    wherein the reflection layer directly contacts the second surface of the transparent substrate, and distributes along the second surface of the transparent substrate,
    wherein the reflection structure further comprises an optical layer, and the optical layer is disposed at one side of the reflection layer opposing to the transparent substrate.

2. The light-emitting device of claim 1, wherein the circuit layer is arranged at one of two opposite sides of the reflection layer away from the second surface of the transparent substrate.

3. The light-emitting device of claim 1, wherein the circuit layer directly contacts the second surface of the transparent substrate, and distributes along the second surface of the transparent substrate.

4. The light-emitting device of claim 1, wherein the light-transmitting window is an opening.

5. The light-emitting device of claim 1, wherein the light-emitting unit comprises a light-emitting member and a reflection cap covering the light-emitting member, the light-emitting member is arranged at one side beneath the second surface of the transparent substrate and electrically connected to the circuit layer of the reflection structure, an opening of the reflection cap corresponds to the light-transmitting window, and the light-emitting member emits light toward the reflection cap.

6. The light-emitting device of claim 1, wherein the light-emitting unit comprises a carrier and a light-emitting member, the light-emitting member is disposed on the carrier and facing toward the second surface of the transparent substrate, and the light-emitting member is electrically connected to the circuit layer of the reflection structure.

7. The light-emitting device of claim 1, wherein the reflection layer comprises aluminum metal material.

8. The light-emitting device of claim 1, wherein the transparent substrate comprises glass material.

9. The light-emitting device of claim 1, wherein the optical layer comprises an organic material being insulating and light-transmitting.

10. The light-emitting device of claim 1, wherein the optical layer comprises an insulation substrate being light-transmitting.

11. The light-emitting device of claim 1, further comprising:
    a driving unit electrically connected to the circuit layer of the reflection structure, wherein the driving unit comprises a driving member.

12. The light-emitting device of claim 11, wherein the driving unit directly contacts the second surface of the transparent substrate, and distributes along the second surface of the transparent substrate.

13. The light-emitting device of claim 11, wherein the driving unit and the light-emitting unit are integrated as one single component.

14. The light-emitting device of claim 11, wherein the driving unit further comprises a substrate, and the driving member is disposed on the substrate and electrically connected to the circuit layer of the reflection structure.

15. The light-emitting device of claim 1, further comprising:
    a light-shielding unit disposed on the first surface of the transparent substrate, wherein the light-shielding unit comprises a plurality of light-shielding portions, and one of the light-shielding portions obstructs the optical path of the light-emitting unit.

16. The light-emitting device of claim 15, wherein one of the light-shielding portions overlays at least a part of the light-transmitting window in a direction perpendicular to the second surface of the transparent substrate.

17. The light-emitting device of claim 15, wherein the light-shielding portions within the light-shielding unit are of a gradual distribution with a density decreasing away from the light-transmitting window.

18. The light-emitting device of claim 15, further comprising:
    an optical member disposed above the first surface of the transparent substrate.

* * * * *